US011257895B2

(12) United States Patent
Jo et al.

(10) Patent No.: US 11,257,895 B2
(45) Date of Patent: Feb. 22, 2022

(54) DISPLAY PANEL COMPRISING A SEALING MEMBER, A FIRST CONDUCTIVE LINE, AND A SECOND CONDUCTIVE LINE

(71) Applicant: Samsung Display Co., Ltd., Yongin-si (KR)

(72) Inventors: Minjun Jo, Yongin-si (KR); Jaekyung Go, Yongin-si (KR); Yongseung Park, Yongin-si (KR); Seonggeun Won, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 36 days.

(21) Appl. No.: 16/824,533

(22) Filed: Mar. 19, 2020

(65) Prior Publication Data

US 2020/0357878 A1 Nov. 12, 2020

(30) Foreign Application Priority Data

May 8, 2019 (KR) .......................... 10-2019-0053901

(51) Int. Cl.
*H01L 27/32* (2006.01)
*H01L 51/52* (2006.01)

(52) U.S. Cl.
CPC ...... *H01L 27/3276* (2013.01); *H01L 27/3262* (2013.01); *H01L 27/3265* (2013.01); *H01L 51/524* (2013.01)

(58) Field of Classification Search
CPC ............. H01L 27/3276; H01L 27/3262; H01L 27/3265; H01L 51/524
See application file for complete search history.

(56) References Cited

U.S. PATENT DOCUMENTS

| 8,896,800 | B2 | 11/2014 | Park et al. | |
|---|---|---|---|---|
| 9,496,320 | B2* | 11/2016 | Hong | ................. H01L 27/3276 |
| 9,825,253 | B2* | 11/2017 | Cho | .................... H01L 27/3244 |
| 10,186,191 | B2 | 1/2019 | Kang et al. | |
| 10,276,824 | B2* | 4/2019 | Jo | ........................ H01L 51/5243 |
| 10,559,597 | B1* | 2/2020 | Li | ............................ G09G 3/20 |

(Continued)

FOREIGN PATENT DOCUMENTS

| CN | 109119447 A | 1/2019 |
|---|---|---|
| CN | 109147572 A | 1/2019 |

(Continued)

OTHER PUBLICATIONS

Extended European Search Report for corresponding European Patent Application No. 20165049.6, dated Jun. 23, 2020, 7 pages.

*Primary Examiner* — Lex H Malsawma
(74) *Attorney, Agent, or Firm* — Lewis Roca Rothgerber Christie LLP

(57) ABSTRACT

A display panel includes: a first substrate including an opening area, a display area, and a non-display area; a plurality of display elements arranged in the display area; a second substrate facing the first substrate with the plurality of display elements therebetween; a sealing member arranged between the first substrate and the second substrate; a first conductive line between the opening area and the display area, the first conductive line being located in the non-display area; a second conductive line located in the non-display area; and at least one insulating layer arranged between the first conductive line and the second conductive line.

18 Claims, 20 Drawing Sheets

(56) References Cited

U.S. PATENT DOCUMENTS

| | | | | |
|---|---|---|---|---|
| 2005/0184927 | A1* | 8/2005 | Kwak | ............... H01L 27/3276 345/45 |
| 2017/0287992 | A1 | 10/2017 | Kwak et al. | |
| 2019/0121211 | A1 | 4/2019 | Luo et al. | |

FOREIGN PATENT DOCUMENTS

| KR | 10-2014-0030704 A | 3/2014 |
|---|---|---|
| KR | 10-2014-0062880 A | 5/2014 |
| KR | 10-2017-0065059 A | 6/2017 |
| KR | 10-2017-0111827 A | 10/2017 |
| KR | 10-1800669 B1 | 12/2017 |

\* cited by examiner

DISPLAY PANEL COMPRISING A SEALING MEMBER, A FIRST CONDUCTIVE LINE, AND A SECOND CONDUCTIVE LINE

CROSS-REFERENCE TO RELATED APPLICATION

This application claims priority to and the benefit of Korean Patent Application No. 10-2019-0053901, filed on May 8, 2019, in the Korean Intellectual Property Office, the disclosure of which is incorporated herein in its entirety by reference.

BACKGROUND

1. Field

One or more embodiments relate to a display panel.

2. Description of Related Art

Recently, the purposes of a display device have become more diversified. Also, as display devices have become thinner and more lightweight, their range of use has gradually been extended. As an area occupied by a display area of display devices increases, functions that may be combined or associated with a display device are being added.

SUMMARY

As ways for adding various functions while increasing an area occupied by a display area, a display panel having various suitable structures such as a structure in which an opening area is formed in a portion of a display area is under development. As a shape of a display panel is diversified, in the case where heat is transferred to a display element through edges of the display panel during or after a manufacturing process of the display panel, the quality of the display panel may be deteriorated. The present disclosure provides a display panel to solve issues including the above issue. The above aspect is provided as a mere example and the scope of the present disclosure is not limited thereto.

Additional aspects will be set forth in part in the description which follows and, in part, will be apparent from the description, or may be learned by practice of the presented embodiments of the disclosure.

According to one or more embodiments, a display panel includes: a first substrate including an opening area, a display area, and a non-display area; a plurality of display elements arranged in the display area; a second substrate facing the first substrate with the plurality of display elements therebetween; a sealing member interposed between the first substrate and the second substrate and located in the non-display area; a first conductive line between the opening area and the display area, the first conductive line being located in the non-display area; a second conductive line located in the non-display area; and at least one insulating layer interposed between the first conductive line and the second conductive line.

The first conductive line and the second conductive line may include different metals, and a thermal conductivity of the first conductive line may be less than a thermal conductivity of the second conductive line.

The first conductive line may be interposed between the first substrate and a first portion of the sealing member, and the second conductive line may be interposed between the first substrate and a second portion of the sealing member.

An end portion of the first conductive line and an end portion of the second conductive line may overlap each other.

An end portion of the first conductive line and an end portion of the second conductive line may be connected to each other through a contact hole defined in the at least one insulating layer.

The first conductive line and the second conductive line may be separated (apart) from each other.

The first portion of the sealing member may entirely surround the opening area, and the second portion of the sealing member may be separated (apart) from the first portion and may entirely surround the display area.

Each of the plurality of display elements may include a pixel electrode, an intermediate layer, and an opposite electrode that are sequentially stacked, and the second conductive line may be electrically connected to the opposite electrode.

The first conductive line may include a plurality of sub-lines.

The first conductive line may further include a bridge line connecting the plurality of sub-lines.

According to one or more embodiments, a display panel includes: a first substrate and a second substrate facing each other with a plurality of display elements therebetween; a sealing member between the first substrate and the second substrate; at least one insulating layer interposed between the first substrate and the sealing member; a first conductive line disposed below a first portion of the sealing member; and a second conductive line disposed below a second portion of the sealing member, wherein the first conductive line and the second conductive line include different materials.

The display panel may further include: a thin film transistor and a storage capacitor, the thin film transistor and the storage capacitor being electrically connected to a respective one of the plurality of display elements, wherein the first conductive line may include the same material as a material of a pixel electrode of the plurality of display elements, a gate electrode of the thin film transistor, and/or an electrode of the storage capacitor, and a thermal conductivity of the first conductive line may be less than a thermal conductivity of the second conductive line.

One of the first conductive line and the second conductive line may be located below the at least one insulating layer, and the other of the first conductive line and the second conductive line may be located over the at least one insulating layer.

An end portion of the first conductive line and an end portion of the second conductive line may overlap each other.

An end of the first conductive line and an end of the second conductive line may be connected to each other through a contact hole defined in the at least one insulating layer.

The second conductive line may include a power supply line providing a voltage to the plurality of display elements.

The first conductive line may include a plurality of sub-lines and a bridge line connecting the plurality of sub-lines.

The first substrate and the second substrate each may include a display area and an opening area, and the first conductive line may be located between the display area and the opening area.

The first conductive line and the second conductive line may partially overlap each other.

The first conductive line and the second conductive line may be separated (and apart) from each other.

The above and other aspects, features, and advantages of certain embodiments of the disclosure will be more apparent from the following description, the drawings, and the claims.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
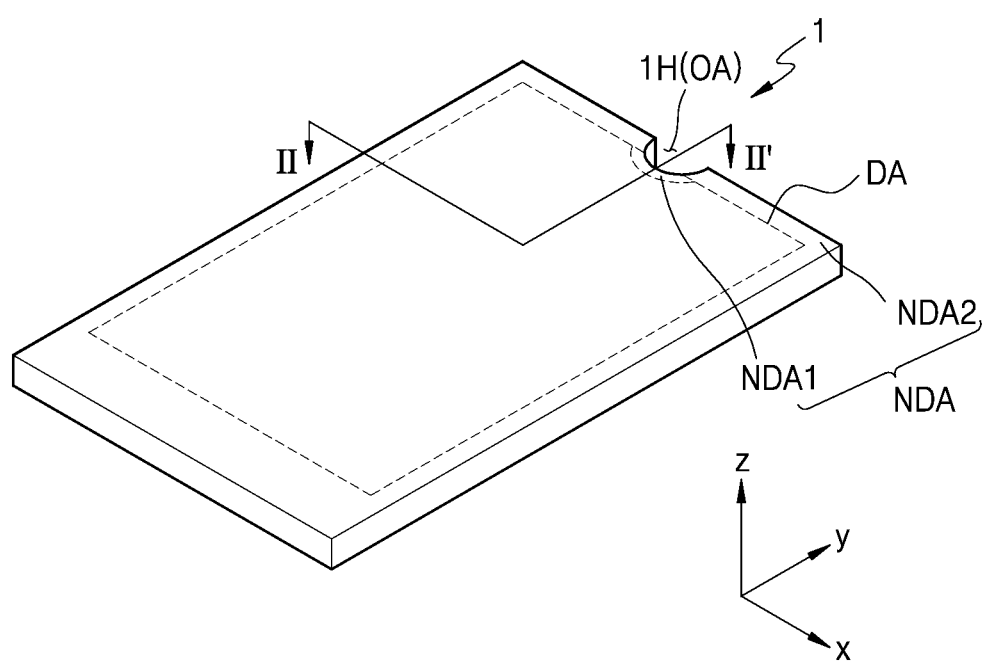
FIG. 1 is a perspective view of a display device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of", when preceding a list of elements, modify the entire list of elements and do not modify the individual elements of the list. Further, the use of "may" when describing embodiments of the inventive concept refers to "one or more embodiments of the inventive concept".

Hereinafter, the disclosure will be described more fully with reference to the accompanying drawings, in which example embodiments of the disclosure are shown. When description is made with reference to the drawings, like reference numerals in the drawings denote like or corresponding elements, and repeated description thereof will not be provided again.

It will be understood that although the terms "first", "second", etc., may be used herein to describe various suitable components, these components should not be limited by these terms. These components are only used to distinguish one component from another.

As used herein, the singular forms "a", "an", and "the" are intended to include the plural forms as well, unless the context clearly indicates otherwise.

It will be further understood that the terms "comprises/includes" and/or "comprising/including" as used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layer(s), region(s), and/or component(s) may be present.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component or may be "indirectly connected" to the other layer, region, or component with other layer(s), region(s), and/or component(s) interposed therebetween. For example, it will be understood that when a layer, region, or component is referred to as being "electrically connected" to another layer, region, or component, it may be "directly electrically connected" to the other layer, region, or component or may be "indirectly electrically connected" to the other layer, region, or component with other layer(s), region(s), and/or component(s) interposed therebetween.

FIG. 1 is a perspective view of a display device 1 according to an embodiment.

Referring to FIG. 1, the display device 1 includes a display area DA and a non-display area NDA. The display device 1 may display a set or predetermined image by using lights emitted from pixels arranged in the display area DA. The display device 1 may include an opening area OA. The opening area OA may be located at an edge of the display area DA and partially surrounded by the display area DA. The display device 1 includes a hole 1H located in the opening area OA. The hole 1H may be an edge hole passing through the display device 1 and be located at (in) the edge of the display area DA.

The non-display area NDA is an area in which pixels are not arranged and may surround the display area DA. A portion of the non-display area NDA may be located between the display area DA and the opening area OA. Hereinafter, in one or more embodiments and for convenience of description, an area of the non-display area NDA that is between the display area DA and the opening area OA is referred to as a first non-display area NDA1, and the rest of the area(s) of the non-display area NDA are collectively referred to as a second non-display area NDA2.

Though the display device 1 according to an embodiment is described as an organic light-emitting display device as an example, a display device according to the present disclosure is not limited thereto. In another embodiment, a display device may be various type (kind)s or kinds of display devices such as an inorganic light-emitting display, a quantum dot light-emitting display, and/or a liquid crystal display. In an embodiment, each pixel of the display device 1 may include an emission layer. The emission layer may include an organic material, include an inorganic material, include a quantum dot, include an organic material and a quantum dot, or include an inorganic material and a quantum dot. In the case where the display device 1 is a liquid crystal display, each pixel may include liquid crystal molecules.

Figure 2A:
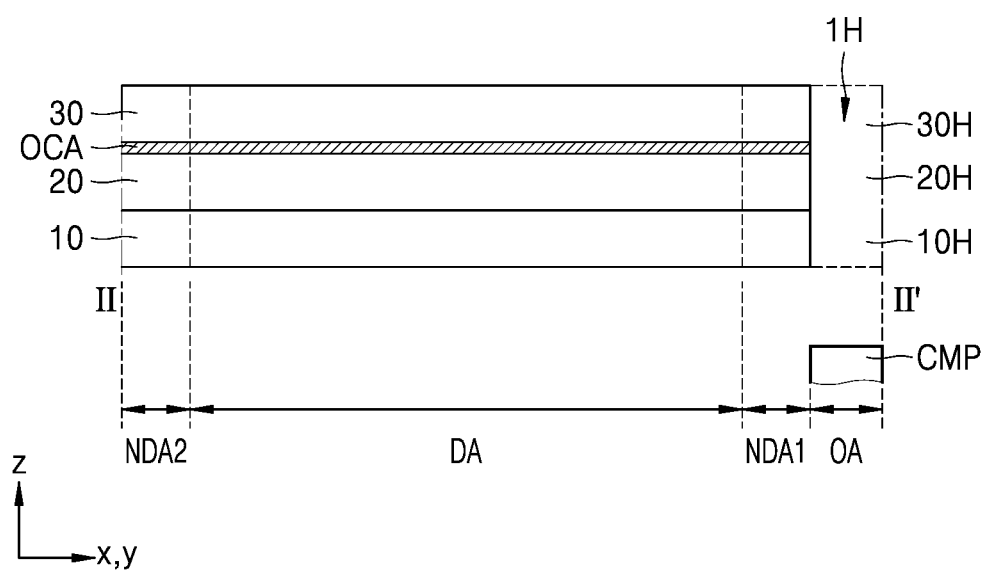
FIGS. 2A to 2C are cross-sectional views of display devices according to embodiments.
Figure 2B:
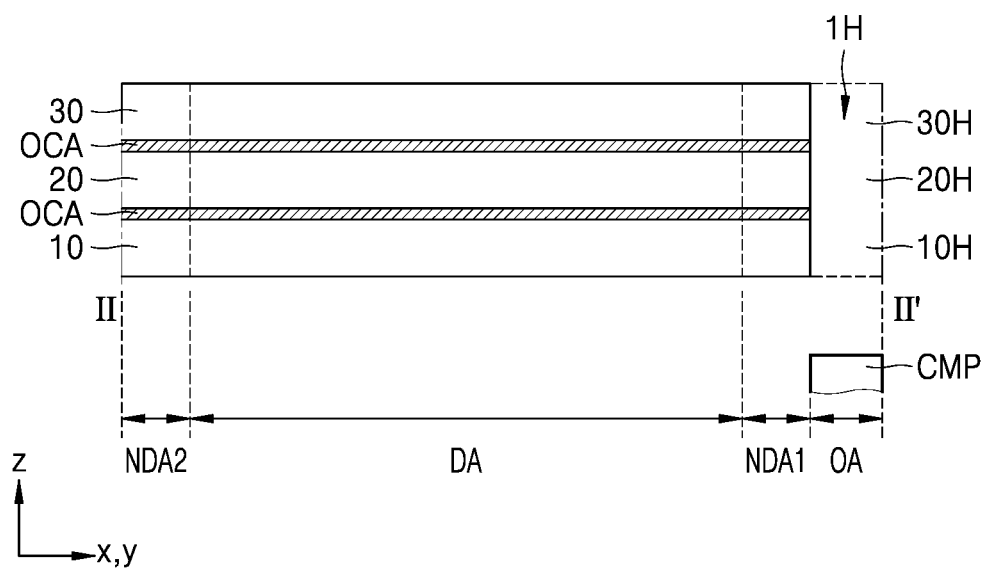
Figure 2C:
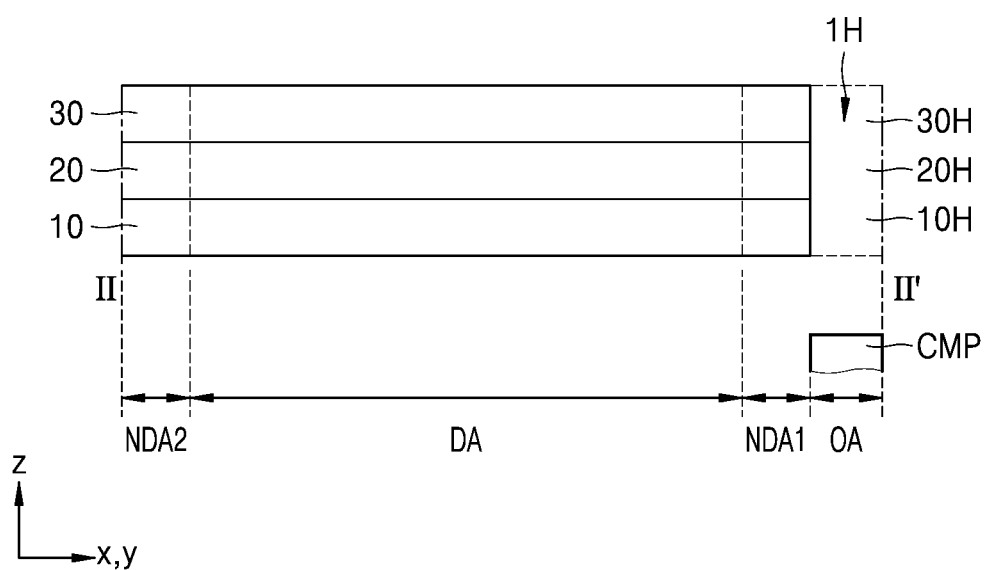

FIGS. 2A to 2C are cross-sectional views of display devices according to embodiments and may each correspond to a cross-sectional view taken along line II-II' of FIG. 1.

Referring to FIGS. 2A to 2C, the display device 1 may include a display panel 10, an input sensing member 20, and an optical functional member 30. The display panel 10 may display an image by using pixels arranged in the display area DA.

The input sensing member 20 obtains coordinate information corresponding to an external input, for example, a touch event. The input sensing member 20 may include a sensing electrode (or a touch electrode) and trace lines, the trace lines being connected to the sensing electrode. The input sensing member 20 may be arranged over the display panel 10. Alternatively, in one or more embodiments, the input sensing member 20 may be arranged over the optical functional member 30.

A process of forming the input sensing member 20 may be successively performed after a process of forming the display panel 10. In this case, as shown in FIGS. 2A and 2C, an adhesive layer may not be arranged between the display panel 10 and the input sensing member 20. In another embodiment, a process of forming the input sensing member 20 may be performed separately from a process of forming the display panel 10. In this case, as shown in FIG. 2B, an adhesive layer such as an optically clear adhesive (OCA) may be arranged between the input sensing member 20 and the display panel 10.

The optical functional member 30 may reduce reflectivity of light (external light) incident toward the display panel 10 from the outside, and/or improve color purity of light emitted from the display panel 10.

In an embodiment, the optical functional member 30 may include a retarder and a polarizer. The retarder may include a film-type (kind) retarder or a liquid crystal-type (kind) retarder. The retarder may include a λ/2 retarder and/or a λ/4 retarder. The polarizer may include a film-type (kind) polarizer or a liquid crystal-type (kind) polarizer. The film-type (kind) polarizer may include a stretchable synthetic resin film, and the liquid crystal-type (kind) polarizer may include liquid crystals arranged in a set or predetermined arrangement. Each of the retarder and the polarizer may further include a protective film. The retarder and the polarizer themselves, or a protective film, may be defined as a base layer of the optical functional member 30.

In another embodiment, the optical functional member 30 may include a black matrix and color filters. The color filters may be arranged by taking into account colors of light emitted respectively from the pixels of the display panel 10. Each of the color filters may include red, green, and/or blue pigment and/or dye. Alternatively, each of the color filters may further include a quantum dot in addition to the pigment and/or dye. Alternatively, some of the color filters may not include the pigment or dye and may include scattering particles such as titanium oxide.

In another embodiment, the optical functional member 30 may include a destructive interference structure. The destructive interference structure may include a first reflection layer and a second reflection layer respectively arranged on different layers. First-reflected light and second-reflected light respectively reflected by the first reflection layer and the second reflection layer may create destructive-interference and thus the reflectivity of external light may be reduced.

The optical functional member (or layer) 30 may be disposed on the input sensing member 20. A process of forming the optical functional member 30 may be performed separately from a process of forming the input sensing member 20. In this case, as shown in FIGS. 2A and 2B, an adhesive layer such as an optically clear adhesive (OCA) may be arranged between the optical functional member 30 and the input sensing member 20. In another embodiment, a process of forming the optical functional member 30 may be successively performed after a process of forming the input sensing member 20. In this case, as shown in FIG. 2C, an adhesive layer may not be arranged between the optical functional member 30 and the input sensing member 20.

Though it is shown in FIGS. 2A to 2C that the optical functional member 30 is arranged on the input sensing member 20, the optical functional member 30 may be disposed under the input sensing member 20 in another embodiment.

The display panel 10, the input sensing member 20, and the optical functional member 30 each may include an opening corresponding to the opening area OA. A hole 10H of the display panel 10, a hole 20H of the input sensing member 20, and a hole 30H of the optical functional member 30 may overlap each other in the opening area OA and may constitute the hole 1H (or an edge hole) of the display device 1.

The opening area OA may include a kind of component area in which a component CMP for adding various suitable functions to the display device 1 is located. The component CMP may include an electronic element. The component CMP may include an electronic element that uses light or sound. For example, an electronic element may be a sensor such as an infrared sensor that emits and/or receives light, a camera that receives light and captures an image, a sensor that outputs and senses light and/or sound to measure a distance and/or recognize a fingerprint, a small lamp that outputs light, and/or a speaker that outputs sound. An electronic element that uses light may use light in various suitable wavelength bands such as visible light, infrared light, and/or ultraviolet light. In an embodiment, the opening area OA may be a transmission area through which light and/or sound, which are output from the component CMP to the outside or propagate toward the electronic element from the outside, may pass.

In the case where the display device 1 provides specific information as in a smartwatch or an instrument panel for an automobile, the component CMP may be a member such as a needle indicating set or predetermined information (e.g., the velocity of a vehicle, a refueled amount, time, etc.). Alternatively, the component CMP may include an element such as a lamp and/or an accessory that increases an esthetic sense of the display device 1.

In one or more embodiments, a window may be arranged on the optical functional member 30, and an adhesive layer may be interposed between the window and the optical functional member 30.

Figure 3:
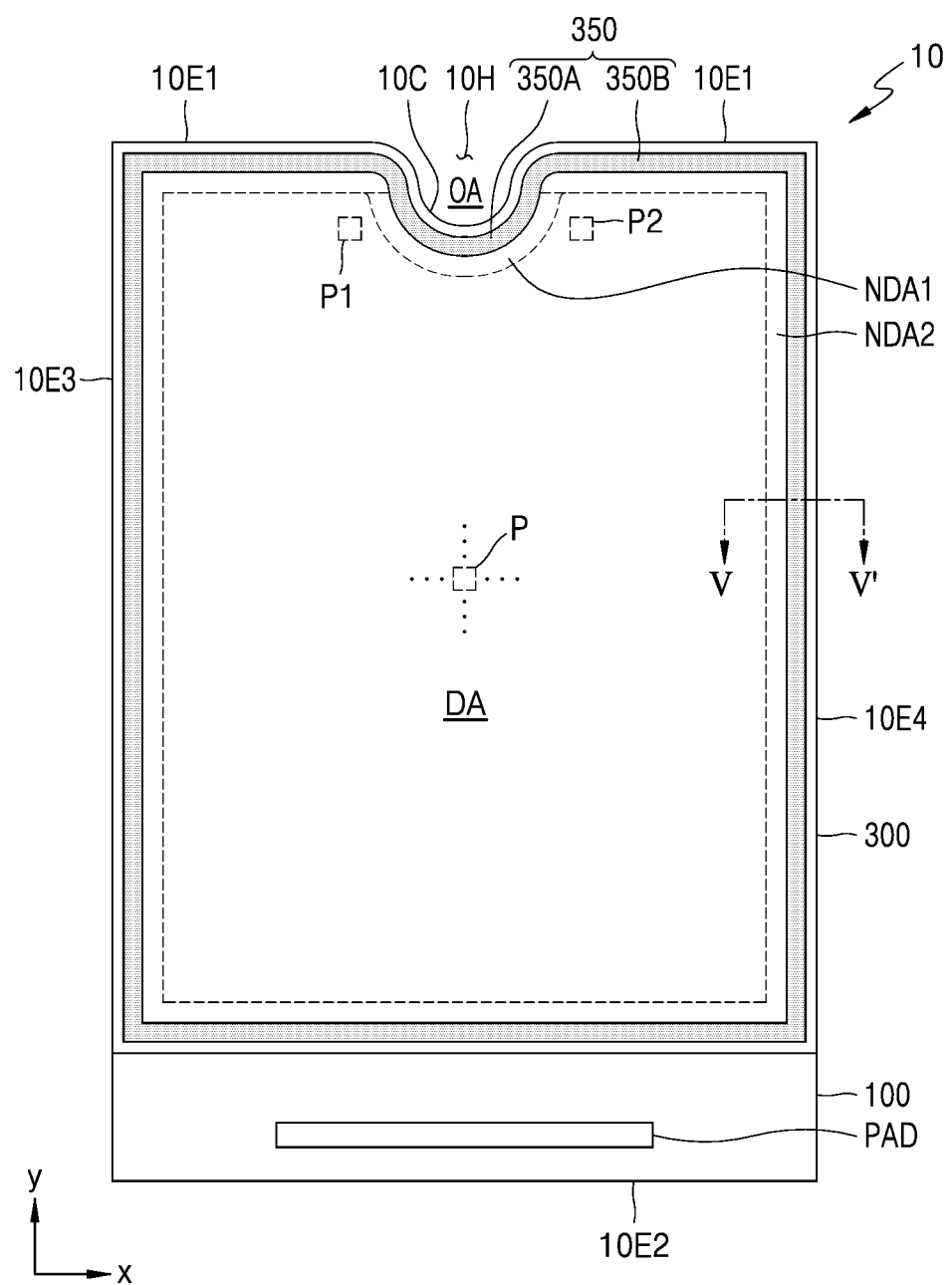
FIG. 3 is a plan view of a display panel according to an embodiment.

FIG. 3 is a plan view of the display panel 10 according to an embodiment.

Referring to FIG. 3, the display panel 10 may include the display area DA, the opening area OA, the first non-display area NDA1, and the second non-display area NDA2. The opening area OA may be located on one side of the display panel 10 and partially surrounded by the display area DA. A first pixel P1 and a second pixel P2 may be apart from each other with the opening area OA therebetween, the first pixel P1 and the second pixel P2 being among a plurality of pixels P arranged in the display area DA.

The display panel 10 may include the hole 10H located in the opening area OA and passing through the display panel 10. The hole 10H may be formed while a portion of an element of the display panel 10 that corresponds to the opening area OA is removed. The display panel 10 may include a first edge 10E1 and a concave edge 10C connected to the first edge 10E1. A boundary of the hole 10H of the display panel 10 may be defined by the concave edge 10C. Though it is shown in FIG. 3 that the display panel 10 includes the first edge 10E1, the second edge 10E2, a third edge 10E3, and a fourth edge 10E4, the third edge 10E3 and the fourth edge 10E4 being longer than the first edge 10E1 and the second edge 10E2 and connecting the first edge 10E1 and the second edge 10E2, the embodiment is not limited thereto. In another embodiment, the display panel 10 may include five or more edges, and include a corner portion located between neighboring edges, the corner portion being rounded unlike that shown in FIG. 3.

The display panel 10 may include a first substrate 100, a second substrate 300, and a sealing member 350. The sealing member 350 may be arranged between the first substrate 100 and the second substrate 300 that overlap each other.

The sealing member 350 may extend along edges of the display area DA so as to surround the display area DA. A first portion 350A of the sealing member 350 may be located between the opening area OA and the display area DA, for example, located in the first non-display area NDA1, and may extend along the concave edge 10C of the display panel 10. A second portion 350B of the sealing member 350 may be located in the second non-display area NDA2 and may extend along the rest of edges of the display panel 10 that exclude the concave edge 10C. The first non-display area NDA1 and the second non-display area NDA2 may be connected to each other, and the first portion 350A and the second portion 350B of the sealing member 350 may be connected as one body.

FIG. 3 may be a figure of the first substrate 100 and/or the second substrate 300 of the display panel 10. For example, the first substrate 100 and/or the second substrate 300 may include the opening area OA, the display area DA, the first non-display area NDA1, and the second non-display area NDA2. Portions of the first substrate 100 and the second substrate 300 that correspond to the opening area OA are respectively removed. The first substrate 100 and the second substrate 300 each may include an edge or a side surface constituting the concave edge 10C.

The first substrate 100 may include a pad unit PAD located in the second non-display area NDA2. The pad unit PAD is not covered by the second substrate 300. The pad unit PAD may be connected to lines (e.g., a data line, a driving voltage line, etc., described below with reference to FIG. 4) through wirings, the lines passing through the display area DA. A driver integrated circuit (IC), including a data driver, may be arranged on the pad unit PAD, or one end portion of a flexible printed circuit board in which a data driver is arranged may be located on the pad unit PAD. A driver IC may be electrically connected to the pad unit PAD through an anisotropic conductive film arranged between the driver IC and the pad unit PAD. The flexible printed circuit board may be electrically connected to the pad unit PAD through various kinds of conductive members.

Figure 4:
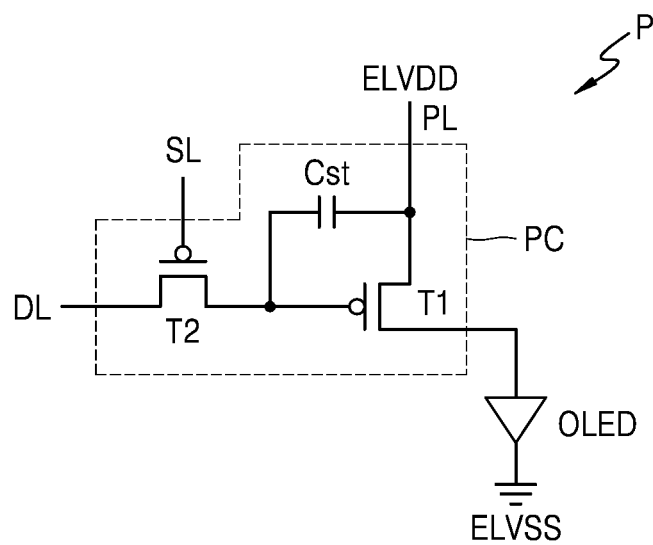
FIG. 4 is an equivalent circuit diagram of one of the pixels in a display panel according to an embodiment.

FIG. 4 is an equivalent circuit diagram of one of the pixels in a display panel according to an embodiment.

As shown in FIG. 4, each pixel P may include a pixel circuit PC and a display element connected to the pixel circuit PC, the display element being an organic light-emitting diode OLED, for example. The pixel circuit PC may include a first thin film transistor T1, a second thin film transistor T2, and a storage capacitor Cst. Each pixel P may emit, for example, red, green, blue, or white light through an organic light-emitting diode OLED.

The second thin film transistor T2 may include a switching thin film transistor, be connected to a scan line SL and a data line DL, and transfer a data voltage input from the data line DL to the first thin film transistor T1 based on a switching voltage input from the scan line SL. The storage capacitor Cst may be connected to the second thin film transistor T2 and a driving voltage line PL, and may store a voltage corresponding to a difference between a voltage transferred from the second thin film transistor T2 and a first power voltage ELVDD supplied through the driving voltage line PL.

The first thin film transistor T1 is a driving thin film transistor and may be connected to the driving voltage line PL and the storage capacitor Cst and may control a driving current flowing through the organic light-emitting diode OLED from the driving voltage line PL in response to the voltage value stored in the storage capacitor Cst. The organic light-emitting diode OLED may emit light having set or predetermined brightness by using the driving current. An opposite electrode (e.g., a cathode) of the organic light-emitting diode OLED may receive a second power voltage ELVSS.

Though it is shown in FIG. 4 that the pixel circuit PC includes two thin film transistors and one storage capacitor, the present disclosure is not limited thereto. The number of thin film transistors and the number of storage capacitors may be variously modified depending on a design of the pixel circuit PC. For example, the pixel circuit PC may further include four or five or more thin film transistors in addition to the two thin film transistors.

Figure 5:
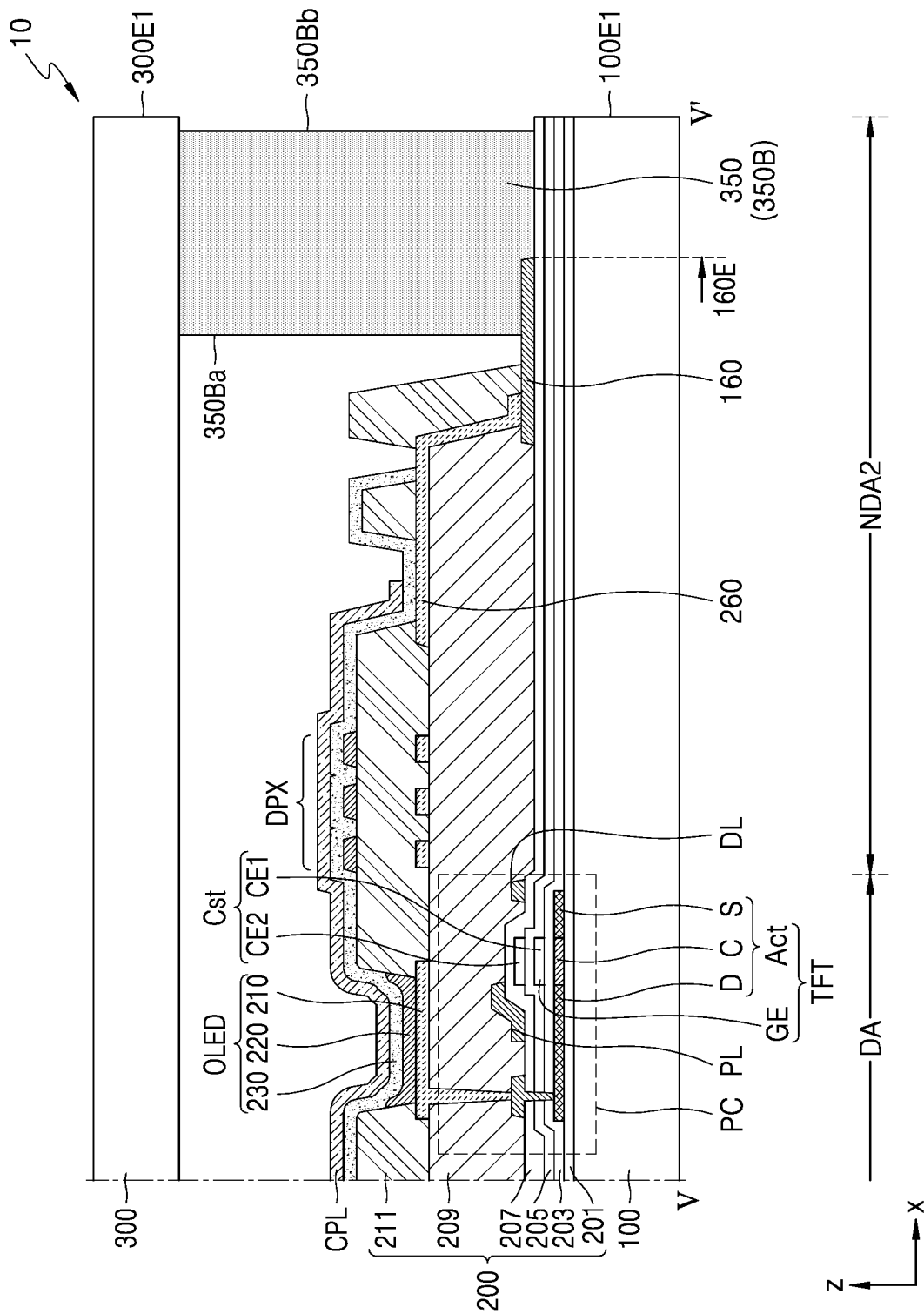
FIG. 5 is a cross-sectional view of a display panel according to an embodiment and shows a display area and a second non-display area.

FIG. 5 is a cross-sectional view of a display panel according to an embodiment and shows a display area and a second non-display area. FIG. 5 may correspond to a cross-section taken along line V-V of FIG. 3.

First, referring to the display area DA of FIG. 5, a display layer 200 is located on the first substrate 100. The display layer 200 may include pixels. Each pixel may include a pixel circuit PC and an organic light-emitting diode OLED connected thereto. The pixel circuit PC may include a thin film transistor TFT and a storage capacitor Cst.

A buffer layer 201 may be interposed between the first substrate 100 and the thin film transistor TFT. The buffer layer 201 may block foreign substances or moisture penetrating through the first substrate 100. The buffer layer 201 may include an inorganic insulating material, for example, silicon oxide, silicon nitride, and/or silicon oxynitride, and include a single layer or a multi-layer including the above materials.

The thin film transistor TFT may include a semiconductor layer Act and a gate electrode GE. The semiconductor layer Act may include, for example, polycrystalline silicon. The semiconductor layer Act may include a channel region C, a source region S, and a drain region D, the channel region C overlapping the gate electrode GE, and the source region S and the drain region D including impurities of higher concentration than concentration of the channel region C. The source region S and the drain region D may respectively be a source electrode and a drain electrode of the thin film transistor TFT. In another embodiment, the semiconductor layer Act may include amorphous silicon, an oxide semiconductor, or an organic semiconductor.

The gate electrode GE may include a low-resistance metal material. The gate electrode GE may include a conductive material including Mo, Al, Cu, and Ti, and include a single layer or a multi-layer including the above materials. In an embodiment, the gate electrode GE may include a metal layer including Mo.

A gate insulating layer 203 may be interposed between the semiconductor layer Act and the gate electrode GE. The gate insulating layer 203 may include an inorganic insulating material, for example, silicon oxide, silicon nitride, and/or silicon oxynitride, and include a single layer or a multi-layer including the above materials.

The storage capacitor Cst may include a first electrode CE1 and a second electrode CE2. A first interlayer insulating layer 205 may be interposed between the first electrode CE1 and the second electrode CE2. The first interlayer insulating layer 205 may include an inorganic insulating material, for example, silicon oxide, silicon nitride, and/or silicon oxynitride, and include a single layer or a multi-layer including the above materials. The second electrode CE2 may include a conductive material including Mo, Al, Cu, and Ti, and include a single layer or a multi-layer including the above materials. In an embodiment, the second electrode CE2 may include a metal layer including Mo.

Though it is shown in FIG. 5 that the storage capacitor Cst overlaps the thin film transistor TFT, and the first electrode CE1 also serves as the gate electrode GE of the thin film transistor TFT, the embodiment is not limited thereto. In another embodiment, the storage capacitor Cst may not overlap the thin film transistor TFT. The first electrode CE1 may be a separate element independent of the gate electrode GE of the thin film transistor TFT.

The storage capacitor Cst may be covered by a second interlayer insulating layer 207. The second interlayer insulating layer 207 may include an inorganic insulating material, for example, silicon oxide, silicon nitride, and/or silicon oxynitride, and include a single layer or a multi-layer including the above materials.

The data line DL and the driving voltage line PL may be disposed on the second interlayer insulating layer 207 and covered by a planarization insulating layer 209. The planarization insulating layer 209 may include an organic insulating material. For example, the planarization insulating layer 209 may include polyimide.

The data line DL and the driving voltage line PL may include a conductive material including Mo, Al, Cu, and/or Ti, and include a single layer or a multi-layer including the above materials. In an embodiment, the data line DL and the driving voltage line PL may include a multi-layer of Ti/Al/Ti in which a titanium layer, an aluminum layer, and a titanium layer are sequentially stacked.

A pixel electrode 210 may be located on the planarization insulating layer 209. The pixel electrode 210 may be electrically connected to the pixel circuit PC through a contact hole passing through the planarization insulating layer 209.

The pixel electrode 210 may include a reflective layer including at least one of Ag, Mg, Al, Pt, Pd, Au, Ni, Nd, Ir, or Cr. The pixel electrode 210 may further include a layer including indium tin oxide (ITO), indium zinc oxide (IZO), zinc oxide (ZnO), or indium oxide ($In_2O_3$), on and/or under the reflective layer.

A pixel-defining layer 211 is located on the pixel electrode 210 and includes an opening that exposes a central portion of the pixel electrode 210. The pixel-defining layer 211 may prevent or protect an arc, etc., from occurring between an end of the pixel electrode 210 and an opposite electrode 230 by insulating and/or increasing a distance between the end of the pixel electrode 210 and the opposite electrode 230. The pixel-defining layer 211 may include an organic material, for example, polyimide and/or hexamethyldisiloxane (HMDSO).

An intermediate layer 220 includes an emission layer. The intermediate layer 220 may include a first functional layer arranged under the emission layer and/or a second functional layer arranged on the emission layer. The intermediate layer 220 may include a low molecular weight material or a polymer material. The first functional layer may include a hole injection layer (HIL) and/or a hole transport layer (HTL). The second functional layer may include an electron transport layer (ETL) and an electron injection layer (EIL). At least one of layers constituting the intermediate layer 220 may be formed as one body in the display area DA. For example, the emission layer of the intermediate layer 220 is located so as to overlap each of the pixel electrodes. In contrast, the first functional layer and/or the second functional layer may be formed as one body so as to correspond to the plurality of pixels.

The opposite electrode 230 is disposed on the intermediate layer 220. The opposite electrode 230 may be formed as one body so as to cover the plurality of pixels. The opposite electrode 230 may include a transparent conductive layer including Ag, Mg, Al, Pt, Pd, Au, Ni, Nd, Ir, Cr, Li, Ca, and/or an alloy thereof.

A capping layer CPL may be located on the opposite electrode 230. The capping layer CPL may include LiF, an inorganic insulating material, and/or an organic insulating material. In an embodiment, the capping layer CPL may be omitted.

Referring to the second non-display area NDA2 of FIG. 5, the sealing member 350 is interposed between the first substrate 100 and the second substrate 300. A first inner surface of the first substrate 100 may face a second inner surface of the second substrate 300, and the sealing member 350 may be located between the first inner surface and the second inner surface. The first substrate 100 includes a first outer surface opposite to the first inner surface, and a first side surface 100E1 connecting the first inner surface and the first outer surface. The first side surface 100E1 of the first substrate 100 may correspond to an edge, for example, the fourth edge 10E4 (FIG. 3) of the display panel 10. Likewise, the second substrate 300 includes a second outer surface opposite to the second inner surface, and a second side surface 300E1 connecting the second inner surface and the second outer surface. The second side surface 300E1 corresponds to a side surface of the second substrate 300. The first side surface 100E1 of the first substrate 100 and the second side surface 300E1 of the second substrate 300 may define the fourth edge 10E4 of the display panel 10 described with reference to FIG. 3.

The sealing member 350 may include, for example, frit. The frit is a member including a glass material, which is a raw material of glass and may have a characteristic of being hardened after being exposed to a laser beam. The frit includes a composition in which $V_2O_5$ (about 15 to about 40 wt %), $TeO_2$ (about 10 to about 30 wt %), $P_2O_5$ (about 1 to about 15 wt %), BaO (about 1 to about 15 wt %), ZnO (about 1 to about 20 wt %), $ZrO_2$ (about 5 to about 30 wt %), $WO_3$ (about 5 to about 20 wt %), and BaO (about 1 to about 15 wt %) are included as main components, and at least one of $Fe_2O_3$, CuO, MnO, $Al_2O_3$, $Na_2O$, and $Nb_2O_5$ is contained as an additive. In another embodiment, the sealing member 350 may include a material such as epoxy.

A conductive line may be disposed below the sealing member 350, for example, between the first substrate 100 and the sealing member 350. With regard to this, it is shown in FIG. 5 that a second conductive line 160 is arranged under a second portion 350B of the sealing member 350 in the second non-display area NDA2.

The second conductive line 160 may include a power supply line that applies power to the pixels arranged in the display area DA. As shown in FIG. 5, the second conductive line 160 may be disposed on the same layer as a layer (the second interlayer insulating layer 207) on which the data line DL or the driving voltage line PL is disposed, and may be electrically connected to the opposite electrode 230 by the medium of a connection electrode layer 260. The opposite electrode 230 may extend beyond dummy pixels DPX and be connected to the connection electrode layer 260, and the connection electrode layer 260 may extend toward the sealing member 350 and be connected to the second conductive line 160. The second conductive line 160 may provide the second power voltage ELVSS described with reference to FIG. 4 to the opposite electrode 230.

The second conductive line 160 is a metal line, may include the same material as that of the data line DL or the driving voltage line PL, and sufficiently secure mechanical strength of the display panel 10.

The second portion 350B of the sealing member 350 may overlap the second conductive line 160 so as to cover a portion of the second conductive line 160. An end 160E of the second conductive line 160 may be located in the sealing member 350, for example, between an outer side surface 350Bb and an inner side surface 350Ba of the second portion 350B of the sealing member 350. In an embodiment, the sealing member 350, for example, the second portion 350B, may have a width of about 200 µm to about 800 µm and have a thickness of about 2 µm to about 10 µm.

The outer side surface 350Bb of the second portion 350B of the sealing member 350 may not be located on the same vertical line as the first side surface 100E1 of the first substrate 100 and the second side surface 300E1 of the second substrate 300. That is, the outer side surface 350Bb of the second portion 350B of the sealing member 350 may be located on a surface different from the first side surface 100E1 of the first substrate 100 and the second side surface 300E1 of the second substrate 300. Alternatively, the outer side surface 350Bb of the second portion 350B of the sealing member 350 may be successively connected to the first side surface 100E1 of the first substrate 100 and the second side surface 300E1 of the second substrate 300 to constitute one surface.

The display panel 10 may be formed by forming a plurality of display panels 10 on a parent substrate, and then cutting the parent substrate into respective display panels 10. In this case, a process of forming the concave edge 10C of the display panel 10 may include a laser ablation process. In an embodiment, after the respective display panels 10 are cut off from the parent substrate, a portion of each display panel 10 corresponding to the opening area OA may be removed. A portion of the display panel 10 corresponding to the opening area OA may be primarily removed by a laser ablation process, and secondarily refined through a polishing process to form the concave edge 10C. In the case where different processes are performed over two times as described above, abrasion of a tool used during a polishing process may be reduced or minimized.

As described above, a process of forming the concave edge 10C of the display panel 10 may be different from a process of forming a straight edge of the display panel 10. In this case, a side surface of each of the first substrate 100 and the second substrate 300 that corresponds to straight edges (e.g., the first to fourth edges) of the display panel 10 may have a shape different from that of a side surface of each of the first substrate 100 and the second substrate 300 that corresponds to the concave edge 10C of the display panel 10. For example, as shown in FIGS. 5 and 7, a straight edge (e.g., the fourth edge 10E4) of the display panel 10 may have a shape different from shapes of side surfaces of the first substrate 100 and side surfaces of the second substrate 300 corresponding to the concave edge 10C.

An organic light-emitting diode OLED of the display panel 10 may be damaged by heat generated during the laser ablation process. In contrast, according to an embodiment, because the first conductive line 150 is disposed in the first non-display area NDA1, the above issue may be prevented or minimized. For example, in the case where the first conductive line 150 is disposed in the first non-display area NDA1, the first conductive line 150 including a material different from that of the second conductive line 160 and being arranged on a layer different from a layer on which the second conductive line 160 is arranged in the second non-display area NDA2, mechanical strength of the display panel 10 may be sufficiently secured, and simultaneously, the organic light-emitting diode OLED may be prevented or protected from being damaged by heat generated while the laser beam is used. Compared to the case where a metal layer including the same material as that of the second conductive line is arranged in not only the second non-display area NDA2 but also the first non-display area NDA1, the display panel 10 including the first conductive line 150 in the first non-display area NDA1 and the second conductive line 160 in the second non-display area NDA2 may reduce a maximum temperature of an organic light-emitting diode OLED by the laser beam by about 25% (about 30°) or more. The above effect may be remarkably represented in the case where a width of the first non-display area NDA1 is less than a width of the second non-display area NDA2.

Figure 6:
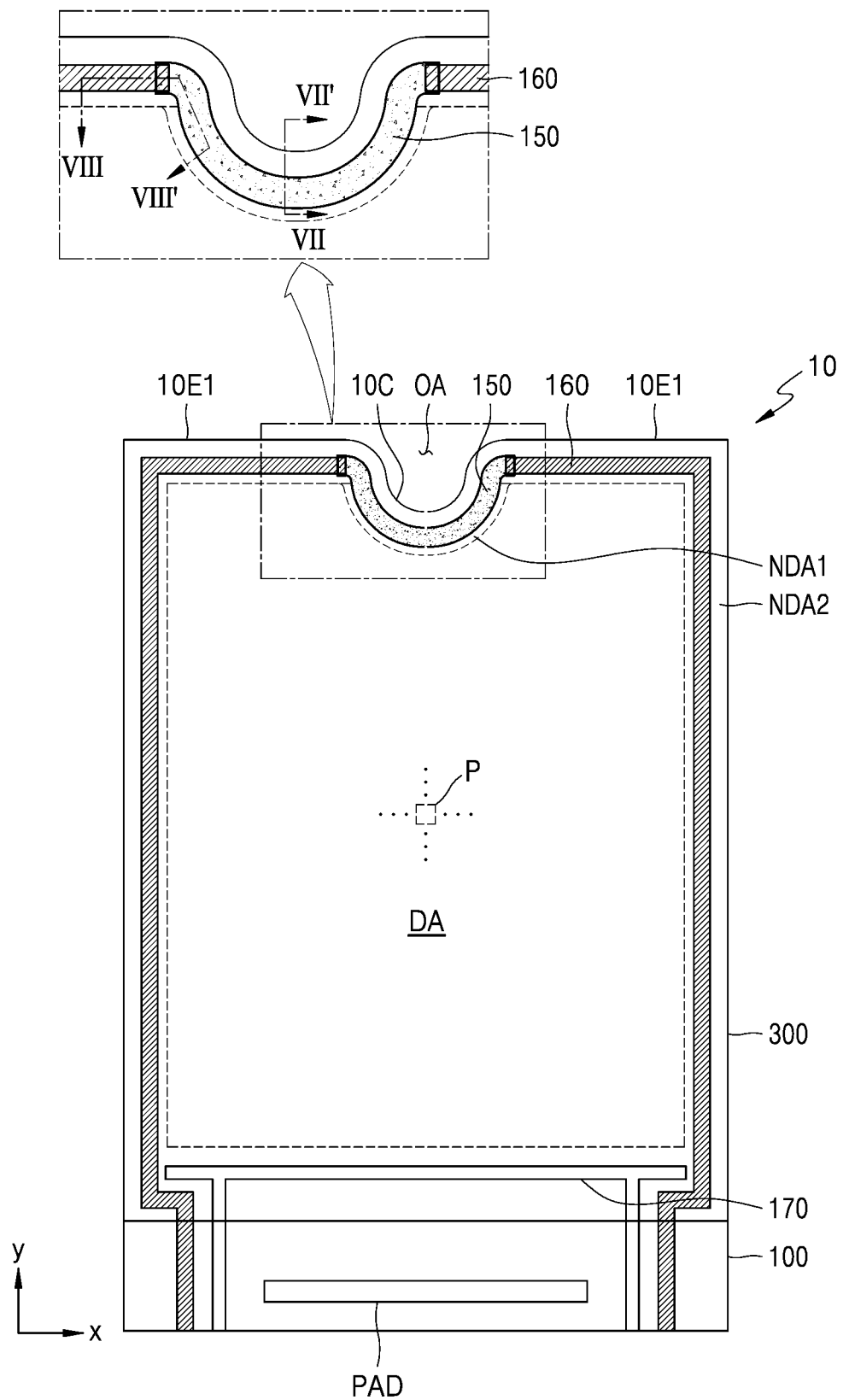
FIG. 6 is a plan view of a first conductive line and a second conductive line of a display panel according to an embodiment.
Figure 7:
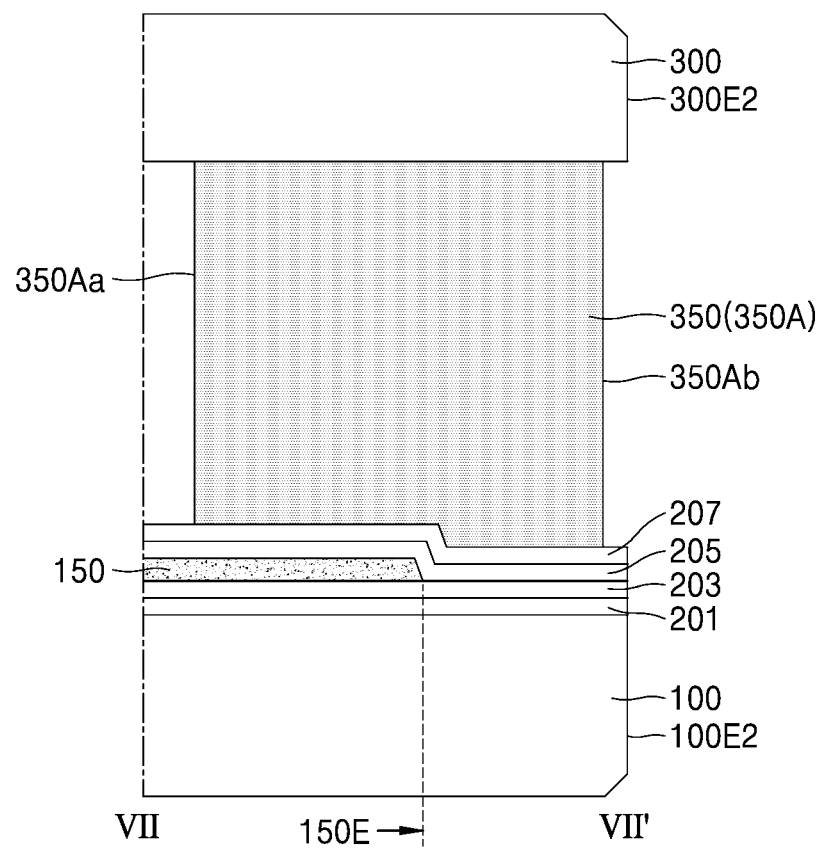
FIG. 7 is a cross-sectional view of a display panel according to an embodiment.

FIG. 6 is a plan view of a first conductive line and a second conductive line of a display panel according to an embodiment, and FIG. 7 is a cross-sectional view of a display panel according to an embodiment and corresponds to a cross-section of the display panel taken along line VII-VII' of FIG. 6.

Referring to FIG. 6, the first conductive line 150 may be disposed in the first non-display area NDA1, and the second conductive line 160 may be arranged in the second non-display area NDA2. A third conductive line 170 may be disposed in the second non-display area NDA2. The third conductive line 170 may provide the first power voltage ELVDD (see FIG. 4) to each pixel. The third conductive line 170 may be electrically connected to the driving voltage line PL (see FIG. 4) of each pixel.

The first conductive line 150 extends along the concave edge 10C of the display panel 10 so as to partially surround the opening area OA in the first non-display area NDA1. The second conductive line 160 may extend along a first edge (a left side), a second edge (a right side), and a third edge (a top side) of the display area DA in FIG. 6, and a portion of the second conductive line 160 corresponding to the third edge may be separated with the opening area OA between the separations of the second conductive line 160.

The first conductive line 150 and the second conductive line 160 may be located on different layers, and at least one insulating layer may be interposed between the first conductive line 150 and the second conductive line 160. As described with reference to FIG. 5, the second conductive line 160 may be arranged on the second interlayer insulating layer 207. Referring to FIG. 7, the first conductive line 150 may be located on the gate insulating layer 203.

The first conductive line 150 may include a material different from that of the second conductive line 160. A thermal conductivity (unit: W/(m·K)) of the first conductive line 150 may be different from that of the second conductive line 160. For example, the thermal conductivity of the first conductive line 150 may be less than that of the second conductive line 160. The first conductive line 150 may include a metal line and include the same material as that of the gate electrode GE and/or the first electrode CE1 of the storage capacitor Cst of the pixel circuit PC described with reference to FIG. 5. The second conductive line 160 may include the same material as that of the data line DL and/or that of the driving voltage line PL as described with reference to FIG. 5.

An end 150E of the first conductive line 150 may be located in the sealing member 350, for example, between an outer side surface 350Ab and an inner side surface 350Aa of the first portion 350A of the sealing member 350. A side surface (third side surface) 100E2 of the first substrate 100 and a side surface (fourth side surface) 300E2 of the second substrate 300 shown in FIG. 7 may define the concave edge 10C of the display panel 10 described with reference to FIG. 3. When viewed in a direction perpendicular or normal to a main surface of the first substrate 100, the third side surface 100E2 of the first substrate 100 and the fourth side surface 300E2 of the second substrate 300 may be respectively continuously connected to the first side surface 100E1 of the first substrate 100 and the second side surface 300E1 of the second substrate 300.

The third side surface 100E2 of the first substrate 100 and the fourth side surface 300E2 of the second substrate 300, each corresponding to the concave edge 10C of the display panel 10, may include an inclination surface as shown in FIG. 7. The inclination surface may be formed by a polishing process. In contrast, the first side surface 100E1 of the first substrate 100 and the second side surface 300E1 of the second substrate 300, each corresponding to the straight edge of the display panel 10, are shown in FIG. 5. Though it is shown in FIGS. 5 and 7 that the side surfaces of the first substrate 100 and the side surfaces of the second substrate 300 have different shapes depending on the edge of the display panel 10, the embodiment is not limited thereto. In another embodiment, the first side surface 100E1 of the first substrate 100 and the second side surface 300E1 of the second substrate 300, each corresponding to the straight edge of the display panel 10, may respectively have the same shapes as those of the third side surface 100E2 of the first substrate 100 and the fourth side surface 300E2 of the second substrate 300, each corresponding to the concave edge 10C of the display panel 10.

Figure 8A:
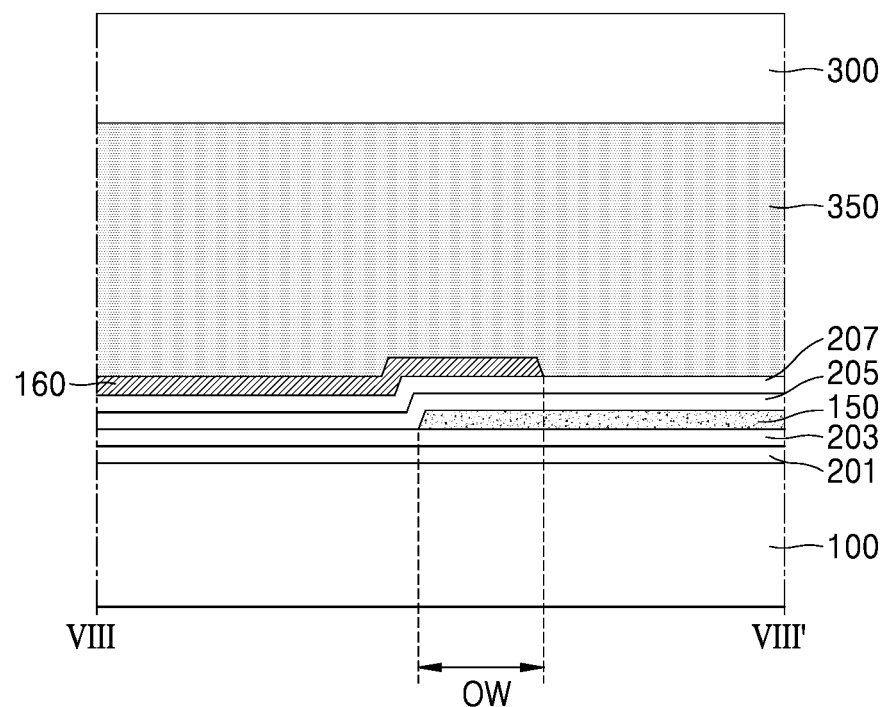
FIGS. 8A to 8C are cross-sectional views of display panels according to embodiments.
Figure 8B:
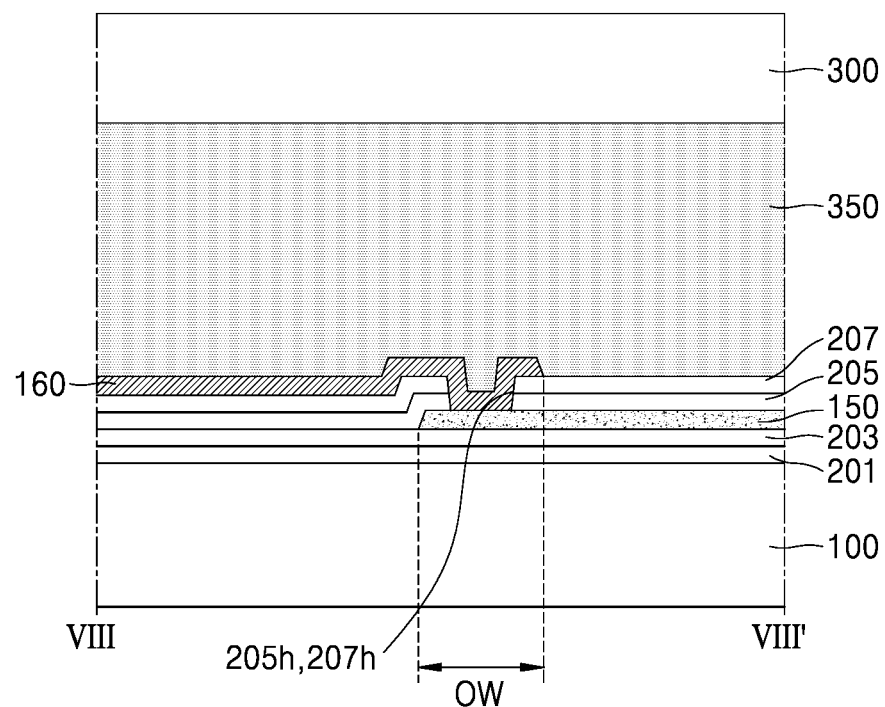
Figure 8C:
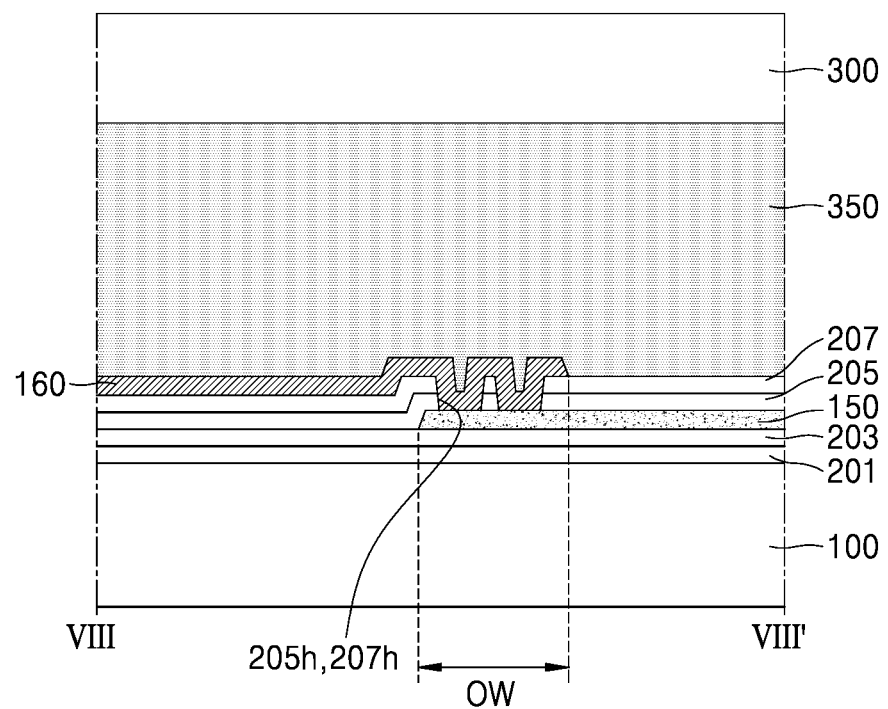

FIG. 8A is a cross-sectional view of a display panel according to an embodiment and corresponds to a cross-section of the display panel taken along line VIII-VIII' of FIG. 6, and FIGS. 8B and 8C are cross-sectional views of display panels according to embodiments and each also corresponds to the cross-section of the display panel taken along line VIII-VIII' of FIG. 6.

Referring to FIG. 8A, the first conductive line 150 may overlap the second conductive line 160. An overlapping width OW of an end of the first conductive line 150 and an end of the second conductive line 160 may be about 10 μm or more. Though it is shown in FIG. 8A that the first conductive line 150 is not electrically connected to the second conductive line 160 with at least one insulating layer, for example, the first interlayer insulating layer 205 and the second interlayer insulating layer 207 therebetween, the embodiment is not limited thereto.

In another embodiment, the first conductive line 150 may be electrically connected to the second conductive line 160 through a contact hole of at least one insulating layer therebetween. For example, as shown in FIGS. 8B and 8C, the second conductive line 160 may be electrically connected to the first conductive line 150 through contact holes 205h and 207h defined in the first interlayer insulating layer 205 and the second interlayer insulating layer 207. The contact holes 205h and 207h respectively defined in the first interlayer insulating layer 205 and the second interlayer insulating layer 207 may be provided as one hole (see FIG. 8B) or as a plurality of holes (see FIG. 8C) in an overlapping region (e.g., a range having the width OW) of the first conductive line 150 and the second conductive line 160.

Figure 9A:
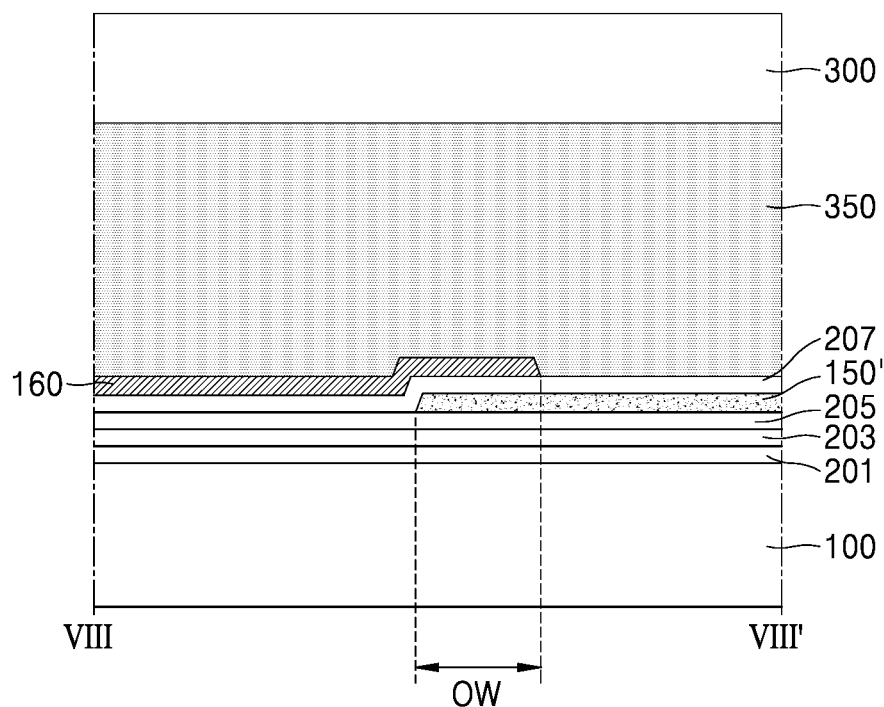
FIGS. 9A to 9C are cross-sectional views of display panels according to embodiments.
Figure 9B:
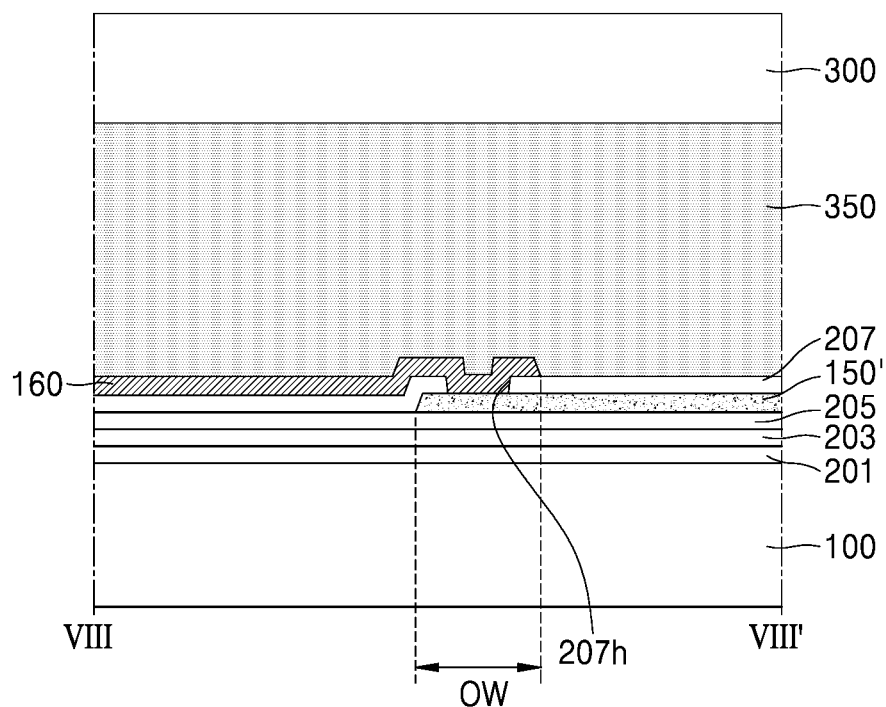
Figure 9C:
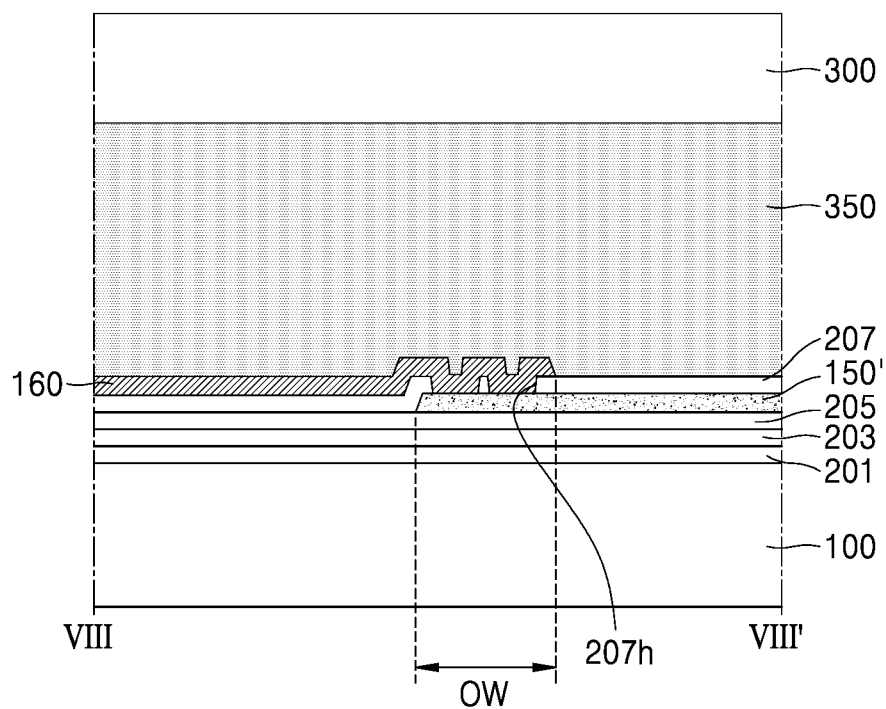

FIG. 9A is a cross-sectional view of a display panel according to an embodiment and corresponds to a cross-section of the display panel taken along line VIII-VIII' of FIG. 6, and FIGS. 9B and 9C are cross-sectional views of display panels according to embodiments and each also corresponds to the cross-section of the display panel taken along line VIII-VIII' of FIG. 6.

Referring to FIGS. 9A to 9C, a first conductive line 150' and the second conductive line 160 are located on different layers. The first conductive line 150' may be disposed on the first interlayer insulating layer 205, and the second conductive line 160 may be arranged on the second interlayer insulating layer 207. The first conductive line 150' may include the same material as that of the second electrode CE2 of the storage capacitor Cst described with reference to FIG. 5.

A portion of the first conductive line 150' and a portion of the second conductive line 160 may overlap each other. An overlapping width OW of the first conductive line 150' and the second conductive line 160 may be about 10 μm or more as described above. As shown in FIG. 9A, the first conductive line 150' may be electrically insulated from the second conductive line 160 by the second interlayer insulating layer 207. Alternatively, as shown in FIGS. 9B and 9C, the first conductive line 150' may be electrically connected to the second conductive line 160 through the contact hole 207h of the second interlayer insulating layer 207. The contact hole 207h defined in the second interlayer insulating layer 207 may be provided as one hole (see FIG. 9B) or as a plurality of holes (see FIG. 9C) in an overlapping region (e.g., a range having the width OW) of the first conductive line 150' and the second conductive line 160.

Figure 10:
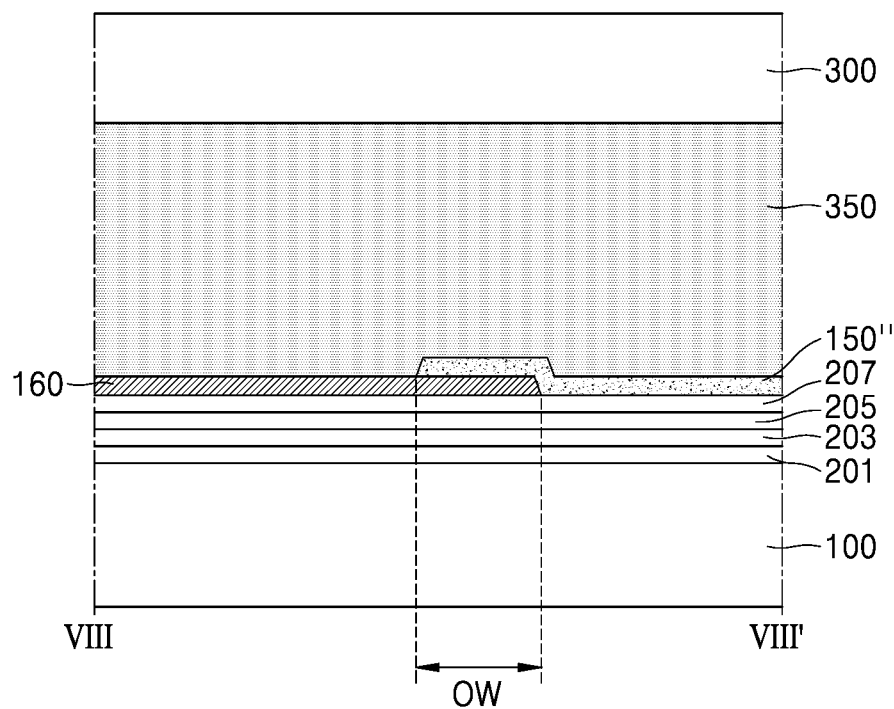
FIG. 10 is a cross-sectional view of a display panel according to an embodiment.

FIG. 10 is a cross-sectional view of a display panel according to an embodiment.

Referring to FIG. 10, an insulating layer may not be arranged between a first conductive line 150" and the second conductive line 160. The second conductive layer 160 may be arranged on the second interlayer insulating layer 207, and the first conductive layer 150" may be located right on the second conductive layer 160. The first conductive layer 150" may include the same material as that of the pixel electrode 210 and/or the connection electrode layer 260 described with reference to FIG. 5.

A portion of the first conductive layer 150" may directly contact and overlap a portion of the second conductive layer 160. An overlapping width OW of the first conductive line 150" and the second conductive line 160 may be about 10 µm or more as described above. A portion of the first conductive line 150" may overlap and directly contact a portion of the second conductive line 160, thereby being electrically connected to the second conductive line 160.

Figure 11:
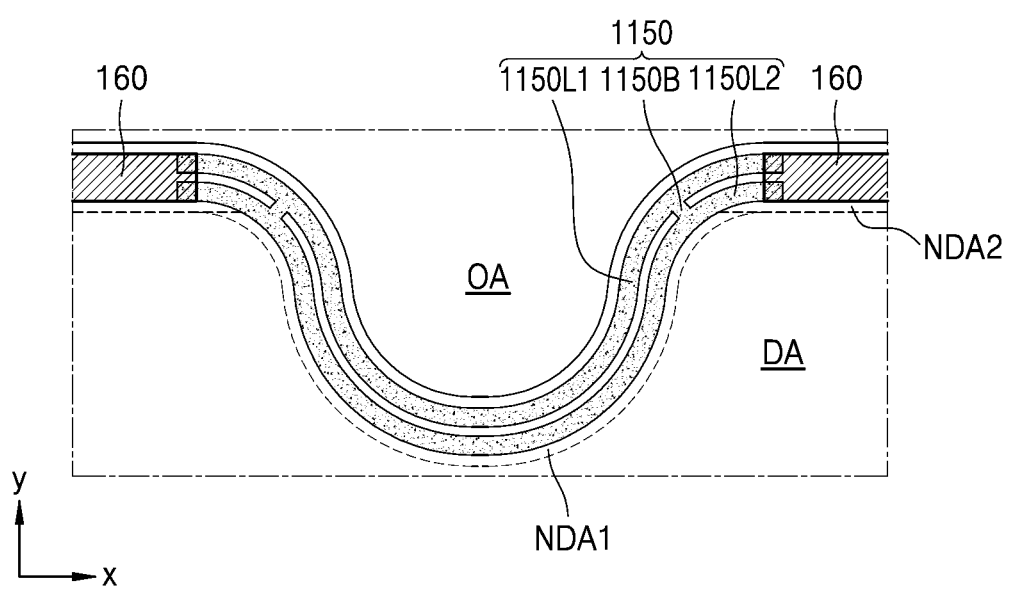
FIG. 11 is a plan view of a portion of a display panel according to an embodiment.
Figure 12:
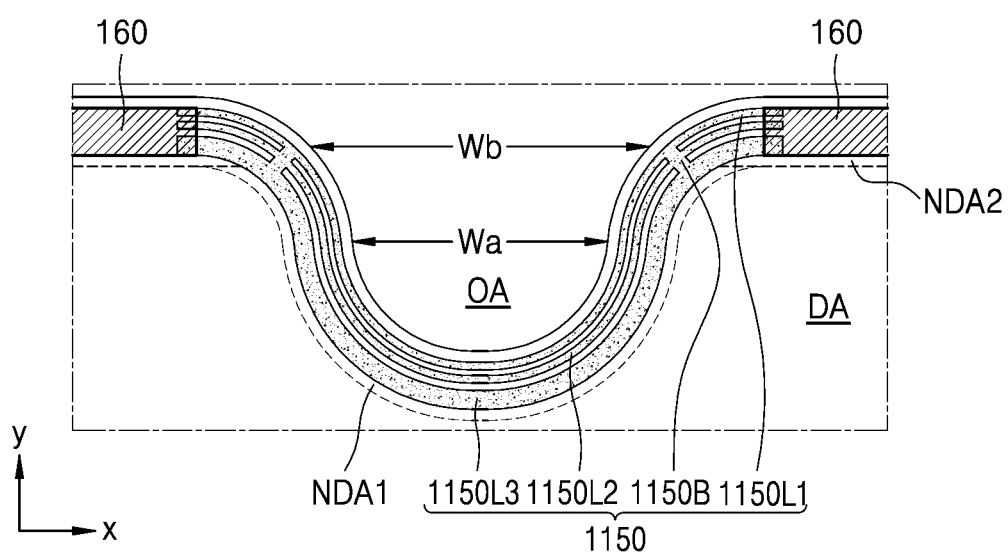
FIG. 12 is a plan view of a portion of a display panel according to an embodiment.
Figure 13:
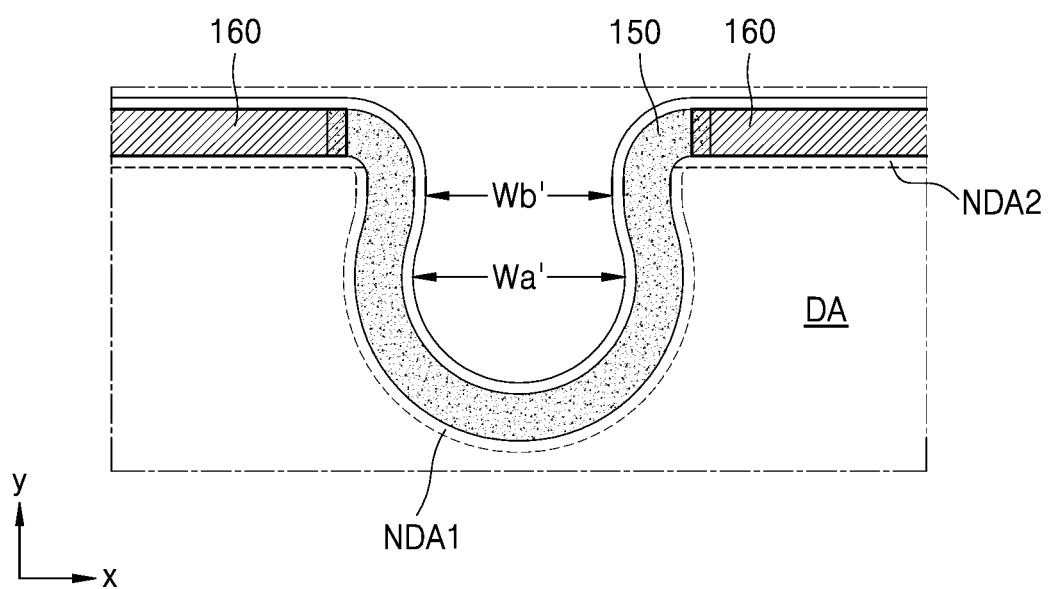
FIG. 13 is a plan view of a portion of a display panel according to an embodiment.

FIGS. 11 to 13 are plan views of portions of display panels according to embodiments.

Unlike the first conductive line 150 described with reference to FIG. 6, a first conductive line 1150 shown in FIG. 11 may include a plurality of sub-lines. For example, the first conductive line 1150 may include a first sub-line 1150L1 and a second sub-line 1150L2. To protect the display panel 10 from external electrostatic discharge, the first sub-line 1150L1 may be electrically connected to the second sub-line 1150L2 by a bridge line 1150B.

The first conductive line 1150 may include a greater number of sub-lines than the two sub-lines shown in FIG. 11. For example, as shown in FIG. 12, the first conductive line 1150 may include the first sub-line 1150L1, the second sub-line 1150L2, and a third sub-line 1150L3. The first sub-line 1150L1, the second sub-line 1150L2, and the third sub-line 1150L3 may be electrically connected to one another by the bridge line 1150B. In another embodiment, the first conductive line 1150 may include four or more sub-lines.

The structures of FIGS. 11 and 12 are applicable to embodiments of the first conductive line described with reference to FIGS. 8 to 10, an embodiment of the first conductive line described below with reference to FIG. 13, and/or embodiments derived therefrom.

It is shown in FIGS. 6 to 12 that the first conductive line partially surrounds the opening area OA. Here, the opening area OA may have a shape having a gradually increasing width toward the outside. For example, as shown in FIG. 12, a width Wa at a first point, which is an inside, may be less than a width Wb at a second point, which is an outside. However, the embodiment is not limited thereto. In another embodiment, referring to FIG. 13, the opening area OA may have a shape in which a width thereof gradually increases and decreases toward the outside and then again gradually increases toward the outside. For example, as shown in FIG. 13, a width Wa' at a first point, which is a relatively inner side, may be greater than a width Wb' at a second point, which is a relatively outer side.

Figure 14:
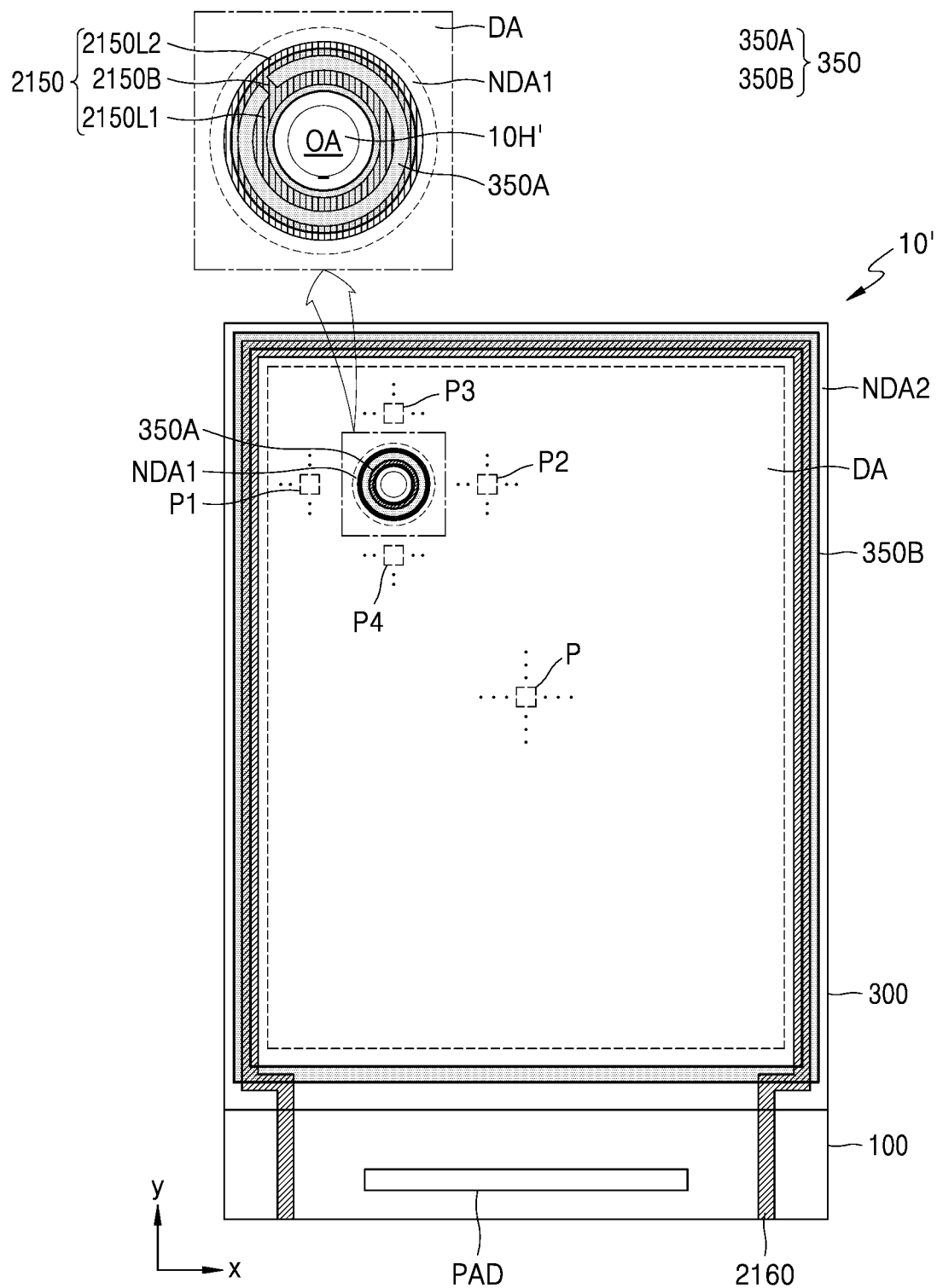
FIG. 14 is a plan view of a display panel according to an embodiment.

FIG. 14 is a plan view of a display panel according to an embodiment.

Referring to FIG. 14, a display panel 10' includes the display area DA, the opening area OA, the first non-display area NDA1, and the second non-display area NDA2. In the display panel 10 described with reference to FIG. 3, the hole 10H passing through the display panel 10 is an edge hole located in an edge of the display panel 10, and the first non-display area NDA1 and the second non-display area NDA2 are connected to each other. In contrast, as shown in FIG. 14, a hole 10H' of the display panel 10' that is located in the opening area OA is arranged inside the display area DA, and thus the first non-display area NDA1 and the second non-display area NDA2 may be separated from each other. The first non-display area NDA1 may be located between the opening area OA and the display area DA and may entirely surround the opening area OA. The second non-display area NDA2 may entirely surround the display area DA. For example, the first pixel P1 and the second pixel P2 arranged in an x-direction among the plurality of pixels P arranged in the display area DA may be separated (spaced apart) from each other with the opening area OA or the hole 10H' therebetween, and a third pixel P3 and a fourth pixel P4 arranged in a y-direction among the plurality of pixels P may be separated from each other with the opening area OA or the hole 10H' therebetween. It may be understood that the hole 10H' is an island type (kind) (i.e., has an island shape) surrounded by a plurality of pixels, for example, is an island hole.

The sealing member 350 may include the first portion 350A and the second portion 350B, the first portion 350A being arranged in the first non-display area NDA1, and the second portion 350B being arranged in the second non-display area NDA2. The first portion 350A and the second portion 350B may be separated from each other. Since a second conductive line 2160 is arranged below the second portion 350B of the sealing member 350 and other characteristics except that the second conductive line 2160 continuously extends along a left side, an upper side, and a right side of the display area DA are similar to those of the second conductive line 160 described above, a difference is mainly described below.

A first conductive line 2150 is arranged below the first portion 350A of the sealing member 350, and may include a plurality of sub-lines. For example, referring to an enlarged view of FIG. 14, the first conductive line 2150 may include a first sub-line 2150L1 and a second sub-line 2150L2, and the first sub-line 2150L1 and the second sub-line 2150L2 may be connected to each other by a bridge line 2150B.

The first conductive line 2150 may be arranged on a layer different from a layer on which the second conductive line 2160 is arranged as described with reference to FIGS. 5 and 7. The first conductive line 2150 may include a material different from that of the second conductive line 2160. For example, the first conductive line 2150 may include a material having a thermal conductivity less than a thermal conductivity of a material of the second conductive line 2160.

The first conductive line 2150 and the second conductive line 2160 are spatially separated from each other. In an embodiment, the first conductive line 2150 may not be electrically connected to the second conductive line 2160. In another embodiment, the first conductive line 2150 may be electrically connected to the second conductive line 2160. For example, similar to the case where the second conductive line 2160 is electrically connected to the opposite electrode in the second non-display area NDA2 as described with reference to FIG. 5, the first conductive line 2150 may be electrically connected to the opposite electrode in the first non-display area NDA1. Therefore, the first conductive line 2150 may have the same voltage level as that of the second conductive line 2160.

According to embodiments, mechanical strength of the display panel may be sufficiently secured, and simultaneously, the display element may be prevented or protected from being damaged by heat generated during or after a manufacturing process of the display panel.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and equivalents thereof.

What is claimed is:

1. A display panel comprising:
a first substrate comprising an opening area, a display area, and a non-display area;
a plurality of display elements arranged in the display area;
a second substrate facing the first substrate with the plurality of display elements therebetween;
a sealing member interposed between the first substrate and the second substrate and located in the non-display area;
a first conductive line between the opening area and the display area, the first conductive line being located in the non-display area;
a second conductive line located in the non-display area; and
at least one insulating layer interposed between the first conductive line and the second conductive line,
wherein the first conductive line and the second conductive line comprise different metals, and the first conductive line is less in thermal conductivity than the second conductive line.

2. The display panel of claim 1, wherein
the first conductive line is interposed between the first substrate and a first portion of the sealing member, and the second conductive line is interposed between the first substrate and a second portion of the sealing member.

3. The display panel of claim 2, wherein
an end portion of the first conductive line and an end portion of the second conductive line overlap each other.

4. The display panel of claim 3, wherein
an end portion of the first conductive line and an end portion of the second conductive line are connected to each other through a contact hole defined in the at least one insulating layer.

5. The display panel of claim 2, wherein
the first conductive line and the second conductive line are apart from each other.

6. The display panel of claim 5, wherein
the first portion of the sealing member entirely surrounds the opening area, and the second portion of the sealing member is apart from the first portion and entirely surrounds the display area.

7. The display panel of claim 1, wherein
each of the plurality of display elements comprises a pixel electrode, an intermediate layer, and an opposite electrode that are sequentially stacked, and
the second conductive line is electrically connected to the opposite electrode.

8. The display panel of claim 1, wherein
the first conductive line comprises a plurality of sub-lines.

9. The display panel of claim 8, wherein
the first conductive line further comprises a bridge line connecting the plurality of sub-lines.

10. A display panel comprising:
a first substrate and a second substrate facing each other with a plurality of display elements therebetween;
a sealing member between the first substrate and the second substrate;
at least one insulating layer interposed between the first substrate and the sealing member;
a first conductive line below a first portion of the sealing member;
a second conductive line below a second portion of the sealing member; and
a thin film transistor and a storage capacitor, the thin film transistor and the storage capacitor being electrically connected to a respective one of the plurality of display elements,
wherein the first conductive line and the second conductive line comprise different materials,
wherein the first conductive line comprises the same material as a material of a pixel electrode of the plurality of display elements, a gate electrode of the thin film transistor, and/or an electrode of the storage capacitor, and
the first conductive line is less in thermal conductivity than the second conductive line.

11. The display panel of claim 10, wherein
one of the first conductive line and the second conductive line is located below the at least one insulating layer, and the other of the first conductive line and the second conductive line is located over the at least one insulating layer.

12. The display panel of claim 11, wherein
an end portion of the first conductive line and an end portion of the second conductive line overlap each other.

13. The display panel of claim 12, wherein
an end of the first conductive line and an end of the second conductive line are connected to each other through a contact hole defined in the at least one insulating layer.

14. The display panel of claim 10, wherein
the second conductive line comprises a power supply line providing a voltage to the plurality of display elements.

15. The display panel of claim 10, wherein
the first conductive line comprises a plurality of sub-lines and a bridge line connecting the plurality of sub-lines.

16. The display panel of claim 10, wherein
the first substrate and the second substrate each comprise a display area and an opening area, and
the first conductive line is located between the display area and the opening area.

17. The display panel of claim 16, wherein
the first conductive line and the second conductive line partially overlap each other.

18. The display panel of claim 16, wherein
the first conductive line and the second conductive line are separated from each other.

* * * * *